(12) United States Patent
Arayashiki et al.

(10) Patent No.: US 8,624,344 B2
(45) Date of Patent: Jan. 7, 2014

(54) SOLID STATE IMAGING DEVICE AND METHOD FOR MANUFACTURING THE SAME

(75) Inventors: Yusuke Arayashiki, Oita (JP); Kazuaki Nakajima, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 13/017,467

(22) Filed: Jan. 31, 2011

(65) Prior Publication Data
US 2011/0187912 A1   Aug. 4, 2011

(30) Foreign Application Priority Data
Feb. 2, 2010   (JP) ................. 2010-020999

(51) Int. Cl.
*H01L 31/0216* (2006.01)
*H01L 31/0232* (2006.01)
(52) U.S. Cl.
USPC ...... 257/434; 257/447; 257/460; 257/E31.12; 257/E31.118
(58) Field of Classification Search
USPC ............ 257/434, 447, 460, E31.12, E31.118
See application file for complete search history.

(56) References Cited

U.S. PATENT DOCUMENTS 4,250,384 A * 2/1981 Pulvari ........................ 250/330

FOREIGN PATENT DOCUMENTS

| JP | 55-155322 | * 12/1980 | ............... G02F 1/01 |
|---|---|---|---|
| JP | 2007-096129 | 4/2007 | |
| JP | 2008-306154 | 12/2008 | |
| JP | 2009-218438 | 9/2009 | |

OTHER PUBLICATIONS

English abstract for JP 55-155322 (JP355155322A), Tada et al., Dec. 1980, 2 pages.*
Office Action issued Jul. 26, 2013, in Japanese Patent Application No. 2010-020999, filed Feb. 2, 2010 (with English-language Translation), 4 pages.

* cited by examiner

*Primary Examiner* — Evan Pert
(74) *Attorney, Agent, or Firm* — Oblon, Spivak, McClelland, Maier & Neustadt, L.L.P.

(57) ABSTRACT

A solid state imaging device according to an embodiment includes a light sensing part which conducts photoelectric conversion on incident light. The solid state imaging device includes a ferroelectric layer including an organic compound on a surface of the light sensing part on which light is incident. The solid state imaging device includes a transparent electrode formed on the ferroelectric layer.

8 Claims, 9 Drawing Sheets

SOLID STATE IMAGING DEVICE AND METHOD FOR MANUFACTURING THE SAME

CROSS-REFERENCE TO RELATED APPLICATION

This application is based upon and claims the benefit of priority from the prior Japanese Patent Application No. 2010-20999, filed on Feb. 2, 2010, the entire contents of which are incorporated herein by reference.

BACKGROUND

1. Field

Embodiments described herein relate generally to a solid state imaging device and a method for manufacturing the solid state imaging device.

2. Background Art

When forming a transparent insulation film on a top face of a light sensing part in a back side illumination CMOS (Complementary Metal Oxide Semiconductor) sensor, it is demanded to form the transparent insulation film at low temperatures in the range of approximately 200 to 300° C. because of constraints imposed on the temperature by a bonding agent used for sticking together and Cu interconnections and it is difficult to form a good quality transparent insulation film on the top face of the light sensing part.

Therefore, the transparent insulation film formed at low temperatures has defects in an interface to the light sensing part and a high interface level. Even in a state in which there is no incidence light, electrons caused by them are detected as a current (called dark current) and appear as noise in image pickup.

In a conventional solid state imaging device proposed as a method for preventing the dark current, a negative fixed charge layer is formed on the top of the light sensing part and holes are attracted to the light sensing side of the light sensing part to form a $P^+$ layer on the top of the light sensing part.

According to the solid state imaging device, electrons generated by a cause such as the interface level are canceled by holes because there is the $P^+$ layer on the light sensing side, and the dark current can be reduced.

$HfO_2$ or the like used as the negative fixed charge layer is premised on that it is formed as a film at low temperatures, however, it is difficult to reduce the defects or interface level.

Furthermore, $HfO_2$ or the like has a high refractive index as compared with $SiO_2$ or SiN used in the transparent film. As a result, the reflectance increases. In a structure having a negative fixed charge layer, therefore, there is a possibility that it will not be able to cope with the conventional transmission film design and limits will be imposed on the final design as well.

Furthermore, a solid state imaging device in which holes are attracted by using a ferroelectric substance instead of the negative fixed charge layer is proposed.

The solid state imaging device includes a plurality of pixels having photoelectric converters, a ferroelectric film which is formed over a photoelectric converter of each pixel via an insulation film and which is formed of an inorganic compound subjected to polarization processing, and a transparent electrode formed on the ferroelectric film.

According to this configuration, effects similar to those of the negative fixed charge layer can be obtained by retaining the polarization of dipoles of the ferroelectric substance even in a state in which voltage is not applied and adjusting the polarization direction to direct the negative charge side toward the light sensing plane.

As for an inorganic ferroelectric substance, however, heat treatment of at least 300° C. is typically needed for film forming and crystallization and its Curie point is high. It is difficult to demonstrate the performance while satisfying the temperature constraints.

Furthermore, it is difficult to use a ferroelectric substance such as barium titanate as a negative charge layer because it has a high refractive index and high temperature processing is needed to conduct sufficient polarization.

DETAILED DESCRIPTION

A solid state imaging device according to an embodiment includes a light sensing part which conducts photoelectric conversion on incident light. The solid state imaging device includes a ferroelectric layer including an organic compound on a surface of the light sensing part on which light is incident. The solid state imaging device includes a transparent electrode formed on the ferroelectric layer.

Hereafter, embodiments of a solid state imaging device and its manufacturing method according to the present invention will be described more specifically with reference to the drawings.

First Embodiment

Figure 1:
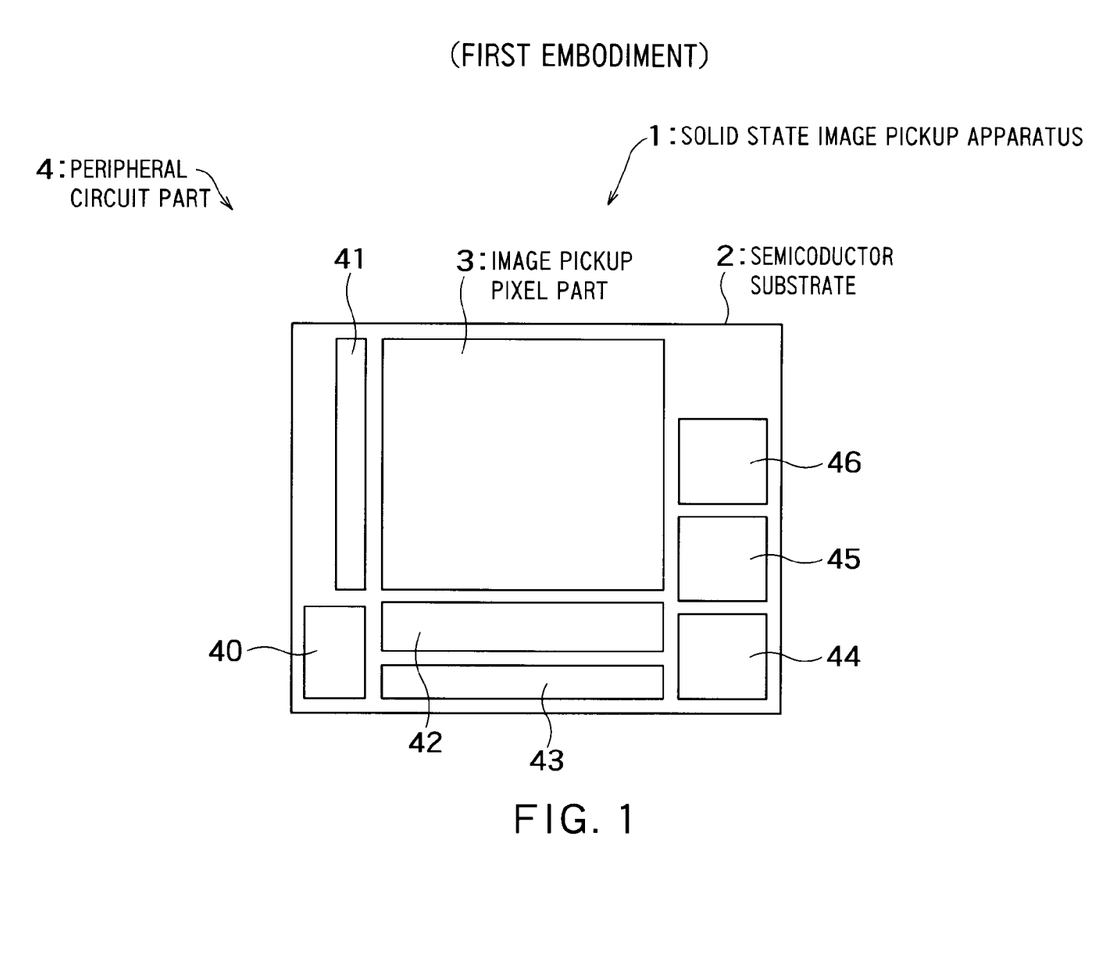
FIG. 1 is a schematic diagram showing a plane layout of an image pickup pixel part and a peripheral circuit part in a solid state imaging device according to a first embodiment of the present invention.

FIG. 1 is a schematic diagram showing a plane layout of an image pickup pixel part and a peripheral circuit part in a solid state imaging device according to a first embodiment of the present invention.

The solid state imaging device 1 is the so-called back side illumination solid state imaging device which receives light incident from the back (a plane opposite form the plane on which the interconnection layer is provided) at its light sensing part. In the present embodiment, the solid state imaging device 1 will be described by taking a CMOS image sensor as an example.

The solid state imaging device 1 is formed by providing an image pickup pixel part 3 and a peripheral circuit part 4 on a semiconductor substrate 2.

In the image pickup pixel part 3, a large number of pixels are arranged in a two-dimensional form. Each pixel includes a light sensing part functioning as a photoelectric converter, such as a photodiode, and a pixel circuit (not illustrated) formed of a plurality of transistors to read a signal obtained by photoelectric conversion in the light sensing part. Furthermore, three pixels respectively having R, G and B color filter layers described later correspond to one picture element which is a minimum unit forming an image.

The peripheral circuit part 4 includes a timing generator 40 which outputs a pulse signal, a vertical selection circuit 41 which selects a signal of pixels in a vertical direction sequentially with a row taken as the unit, a correlated double sampling circuit 42 which reads a signal of a pixel by controlling a transistor of each pixel in synchronism with a pulse signal supplied from the timing generator 40, a horizontal selection circuit 43 which outputs an output signal of the correlated double sampling circuit 42 to a gain control circuit 44, the gain control circuit 44 which exercises gain control on a signal supplied from the horizontal selection circuit 43, an A/D conversion circuit 45 which conducts analog-digital conversion on an output signal of the gain control circuit 44, and a digital amplifier 46 which amplifies a digital signal supplied from the A/D conversion circuit 45.

Figure 2:
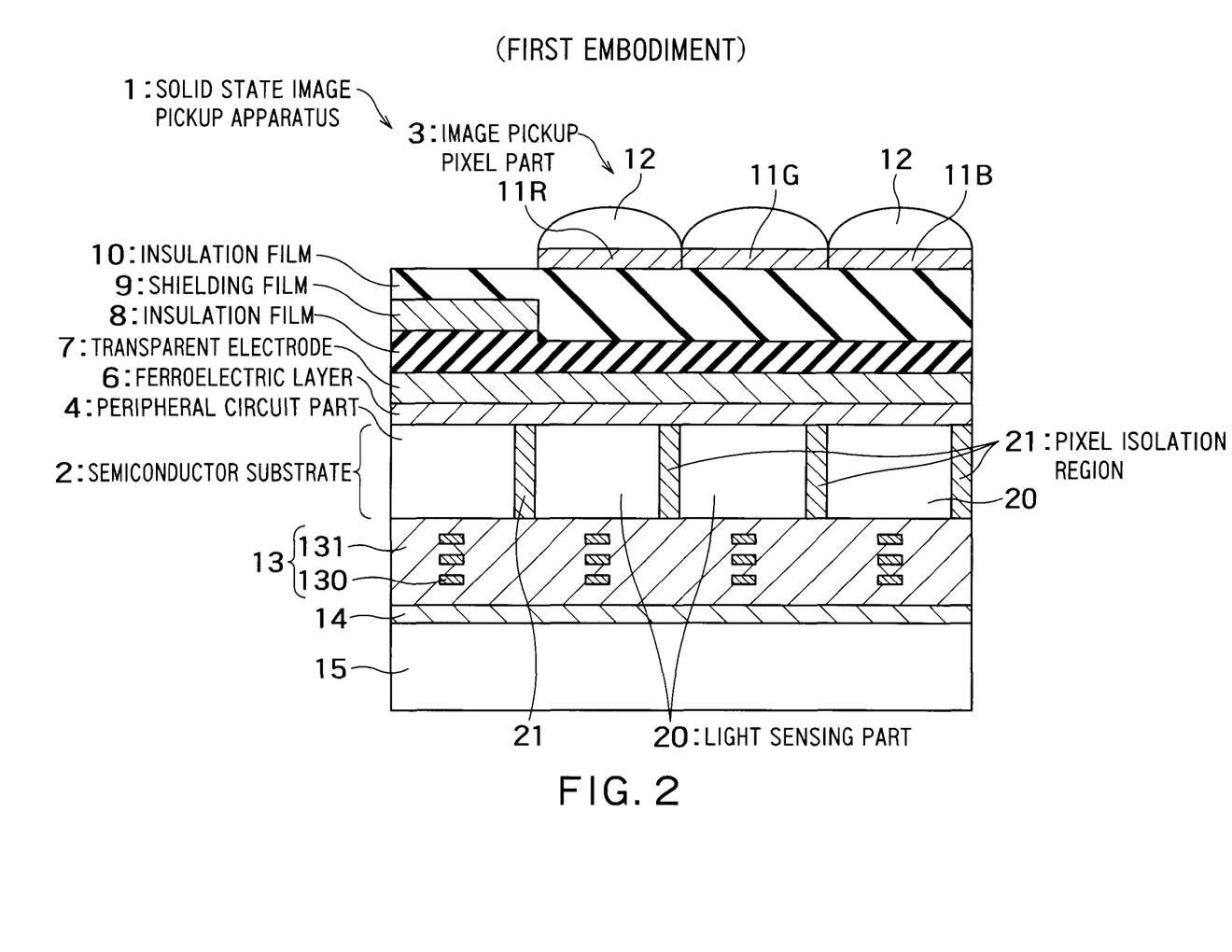
FIG. 2 is a principal part sectional view showing a schematic configuration of a solid state imaging device according to a first embodiment of the present invention.

FIG. 2 is a principal part sectional view showing a schematic configuration of a solid state imaging device according to a first embodiment of the present invention.

The solid state imaging device 1 includes a semiconductor substrate 2, which in turn includes light sensing parts 20 (three pixels respectively for R, G and B are shown in FIG. 2), a pixel circuit, pixel isolation regions 21 which isolate the light sensing parts 20, and the peripheral circuit part 4, a ferroelectric layer 6 having ferroelectricity formed on the semiconductor substrate 2, a transparent electrode 7 formed on the ferroelectric layer 6, an insulation film 8 formed on the transparent electrode 7, a shading film 9 formed on parts of the insulation film 8 corresponding to the peripheral circuit part 4, an insulation film 10 formed on the insulation film 8 to cover the shading film 9, color filter layers 11R, 11G and 11B (hereafter referred to collectively as "color filter layer 11" as well) formed on the insulation film 10, condenser lenses 12 formed on the color filter layer 11, an interconnection layer 13 formed under the semiconductor substrate 2, and a support substrate 15 formed of a silicon substrate bonded to the bottom of the interconnection layer 13 by an adhesive agent 14.

The ferroelectric layer 6 is below 210° C. in the melting point, and more favorably below 160° C. The ferroelectric layer 6 can be formed at a temperature slightly lower than the melting point, i.e., at a temperature below 200° C., or more favorably at a temperature below 150° C. The ferroelectric layer 6 is formed of an organic compound having light transmittance and ferroelectricity.

As an organic compound having ferroelectricity, for example, a vinylidene fluoride compound can be used. Vinylidene fluoride compounds include at least one of vinylidene fluoride (VDF), a homopolymer of vinylidene fluoride (VDF), i.e., polyvinylidene fluoride (PVDF), a copolymer of VDF and a monomer which can be copolymerized with VDF, such as, for example, a copolymer (VDF/TrFE) of vinylidene fluoride (VDF) and ethylene trifluoride (TrFE) and a copolymer (VDF/TeFE) of vinylidene fluoride (VDF) and ethylene tetrafluoride (TeFE).

VDF and PVDF have ferroelectricity. VDF and PVDF have a refractive index n=1.42 in the range of n=1.3 to 1.5, and it is nearly equivalent to that of $SiO_2$. VDF and PVDF can be formed at low temperatures (approximately 150° C. or below).

The VDF/TrFE copolymer and the VDF/TeFE copolymer have a suitable mole composition range which is suitable with respect to the polarization quantity. For example, as for the VDF/TrFE copolymer, it is desirable to copolymerize VDF and TrFE with a mole ratio in the range of 65:30 to 85:15, and it is further desirable to copolymerize VDF and TrFE with a mole ratio of 75:25. The VDF/TrFE copolymer is stronger than PVDF single substance in polarization, and its refractive index is n=1.42, which is nearly equivalent to $SiO_2$. The VDF/TrFE copolymer can attract holes to the top face of the light sensing part 20 intensely than the PVDF, and can be formed at low temperatures (150° C. or below).

For revealing ferroelectricity of the ferroelectric layer 6, a voltage must be applied between the electrode (transparent electrode 7) and the substrate (semiconductor substrate 2) at least once. Therefore, it is necessary to conduct processing (poling) to apply the voltage at arbitrary timing after the electrode is formed and align polarizations.

As for the ferroelectric layer 6, a layer having a film thickness in the range of 0.1 to 200 nm can be used. Since the applied voltage at the time of poling can be made small, a range of 0.1 to 50 nm is desirable.

As the transparent electrode 7, for example, indium tin oxide (ITO), zinc oxide, tin oxide or the like can be used. The transparent electrode 7 having a film thickness in the range of 1 to 1,000 nm can be used. If the transparent electrode 7 is too thin, the electric resistance becomes high although the light transmittance is great. Therefore, it is desirable that the transparent electrode 7 has a film thickness in the range of 5 to 100 nm.

As for the insulation film 8 and the insulation film 10, a material obtained by selecting one out of $SiO_2$, SiON and SiN having transmittance with respect to incident light or combining at least two of them can be used.

As for the shading film 9, for example, aluminum, tungsten or the like can be used.

The color filter layers 11R, 11G and 11B are formed of, for example, resists including dyes which selectively transmit light having red, green and blue wavelengths, respectively. The color filter layers 11R, 11G and 11B are formed over the light sensing part 20 in a predetermined order.

The interconnection layer 13 includes a plurality of interconnections 130 formed of Cu or the like, and an inter-layer insulation film 131 formed of $SiO_2$ or the like.

As for the adhesive agent 14, for example, SOG (spin on glass) cured by heat treatment in the range of 300 to 400° C. can be used.

(Manufacturing Method for Solid State Imaging Device)

An example of a manufacturing method for a solid state imaging device will now be described.

In the semiconductor substrate 2, N-type regions which form photodiodes of the light sensing parts 20, a pixel circuit including a plurality of transistors, the pixel isolation regions 21, and the peripheral circuit part 4.

Then, the interconnection layer 13 is formed on a face of the semiconductor substrate 2 having the N-type regions of the light sensing parts 20 formed thereon. The adhesive agent 14 is formed on the interconnection layer 13. The support substrate 15 is bonded to the interconnection layer 13 via the adhesive agent 14. And heat treatment in the range of 300 to 400° C. is conducted to cure the adhesive agent 14 and fix the support substrate 15 to the interconnection layer 13.

Then, the back side of the semiconductor substrate 2 is polished until the N-type regions are exposed, resulting in a thinner semiconductor substrate 2. And P-type regions which form photodiodes are formed on the back side of the pixel isolation region 21 and N-type regions in the image pickup pixel part 3 by ion injection.

Then, the ferroelectric layer 6 formed of, for example, VDF/TrFE copolymer is formed on the P-type region as an organic compound having ferroelectricity. As for the film forming method of ferroelectric macromolecules, a spin coat method by applying a solution, the LB (Langmuir-Blodgett) method, and the vacuum evaporation method are considered to be suitable. In the present embodiment, the spin coat method is used. In the case of the LB method, the heat treatment can be made unnecessary, because dipoles are oriented on the substrate by transferring the substrate to the organic compound developed on the liquid surface.

Then, the transparent electrode 7 is formed on the ferroelectric layer 6 by using the vacuum evaporation method, the sputtering method, the cluster beam evaporation method.

Figure 3:
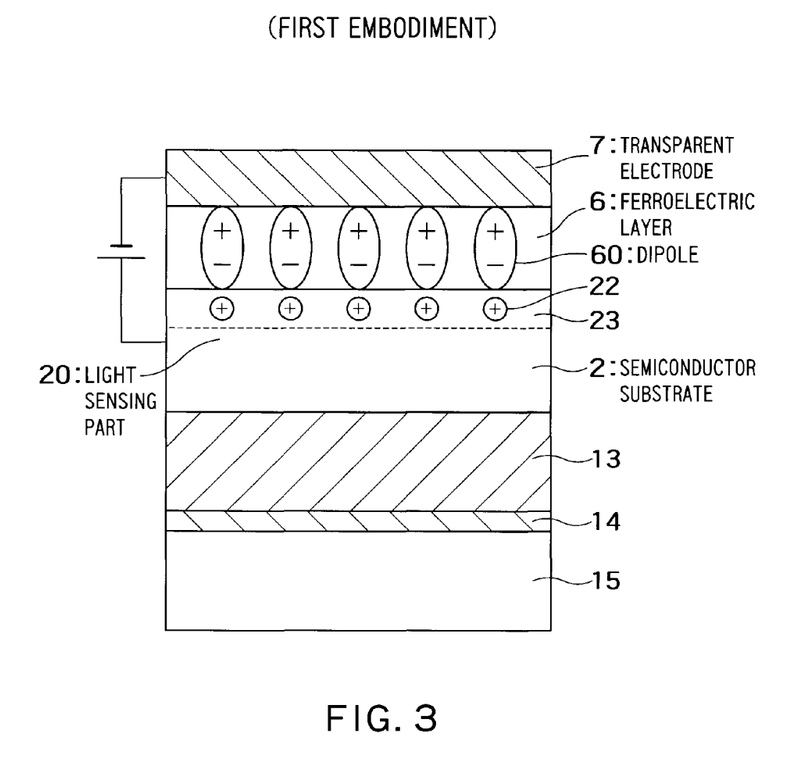
FIG. 3 is a diagram for explaining the poling of the ferroelectric layer.
Figure 4:
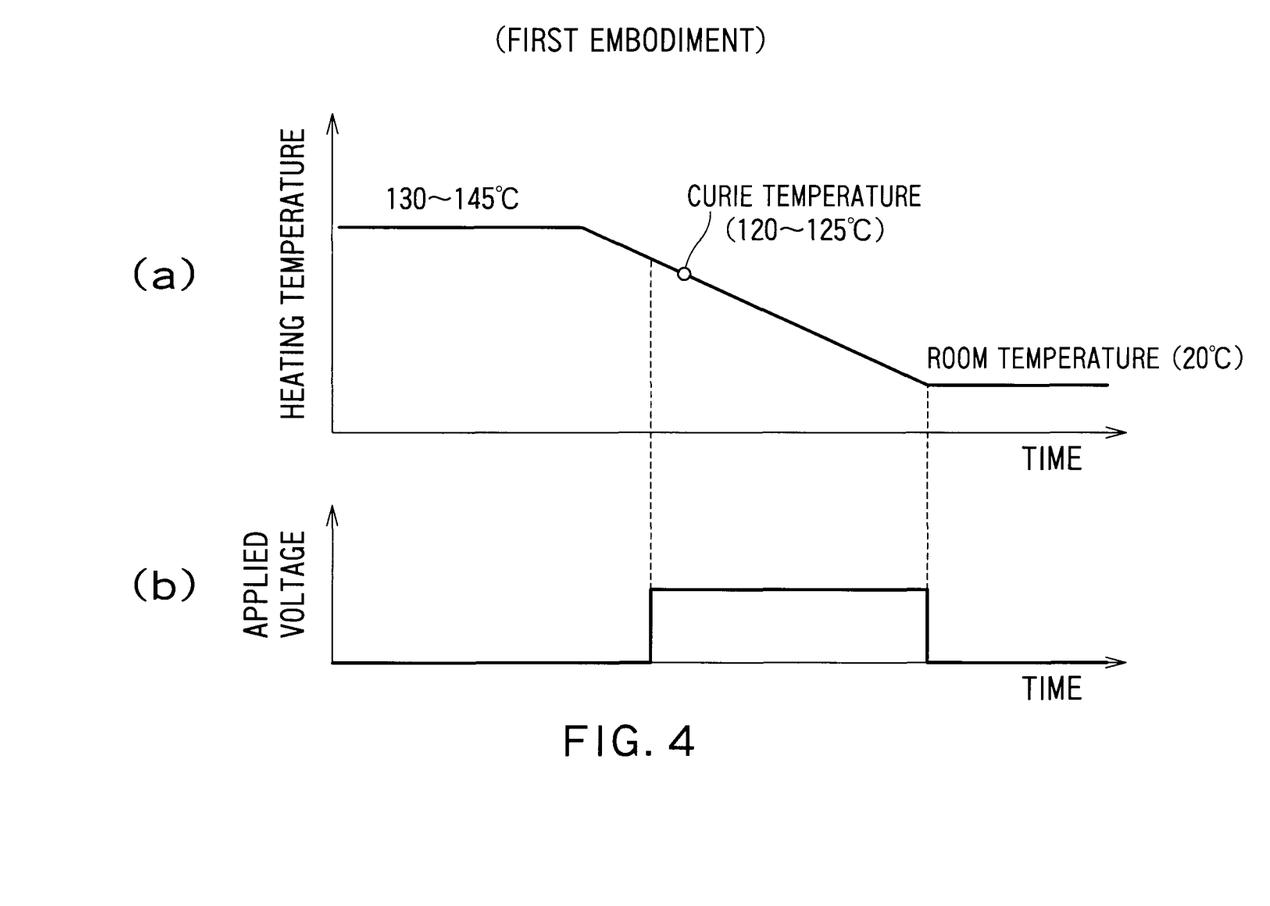
FIG. 4(a) is a diagram showing an example of a heating temperature waveform.
FIG. 4(b) is a diagram showing an example of applied voltage waveform.

FIG. 3 is a diagram for explaining the poling of the ferroelectric layer. FIG. 4(*a*) is a diagram showing an example of a heating temperature waveform. FIG. 4(*b*) is a diagram showing an example of applied voltage waveform.

After the transparent electrode 7 is formed as a film, heat treatment is conducted as shown in FIG. 4(*a*). In the case where the ferroelectric layer 6 is the vinylidene fluoride (VDF) compound, conducting heat treatment at a temperature (in the range of approximately 130 to 145° C.) which is slightly lower the melting point (approximately 150° C.) can improve the polarization orientation and cause stronger polarization. Since the vinylidene fluoride (VDF) compound becomes hard to reveal the ferroelectricity if it is melted and recrystallized, it becomes necessary to select a process conducted at 150° C. or less, in the ensuing process.

Before the temperature falls to the Curie temperature (120 to 125° C.), a voltage is applied to become negative on the transparent electrode 7 and become positive on the semiconductor substrate 2 side as shown in FIGS. 3 and 4(*b*). The magnitude of the voltage is changed according to the film thickness of the ferroelectric layer 6 to apply an electric field corresponding to 100 MV/m. Owing to this voltage applying, dipoles 60 of the ferroelectric layer 6 are aligned in the vertical direction (poling) and ferroelectricity is revealed. Since the dipoles 60 are directed in a direction opposite to the applied voltage, the dipoles 60 have positive charges on the transparent electrode 7 side and negative charges on the semiconductor 2 side. As a result, the dipoles 60 attract holes 22 in the photodiodes and form a P$^+$ layer (hole storage layer) 23 in an upper part of the light sensing part 20 in the semiconductor substrate 2.

If the temperature falls to the room temperature (20° C.), voltage applying is stopped. It is desirable to leave the interconnections connected to the transparent electrode 7 even after the poling. Even if depolarization is caused by use of the solid-state imaging device and the performance is degraded, the polarization state of the ferroelectric layer 6 can be restored to the original state by applying the voltage between the electrode and the substrate again if the interconnections are left.

Incidentally, the timing of the poling is not restricted to the way of the temperature falling in the heat treatment, but the poling may be conducted at arbitrary timing before completion of the solid state imaging device.

Then, the insulation film 8 is formed on the transparent electrode 7. As for the film forming method, the PVD method and the spin coat method capable of forming the film at low temperatures are considered to be suitable. However, there is no problem even if the CVD method is used as long as the conditions are satisfied. In the case of an organic ferroelectric substance, the temperature used in the process needs to be the upper limit temperature (150° C.) of the heat processing or below, because the ferroelectricity is lost if it melts.

Then, the shading film 9, the insulation film 10, the color filter layer 11, and the condenser lenses 12 are formed through typical processes, and the desired solid state imaging device 1 is obtained.

According to the first embodiment, the P$^+$ layer 23 is formed in the upper part of the light sensing part 20 by poling the ferroelectric layer 6 formed on the light sensing part 20, and electrons generated at the interface level can be recombined in the P$^+$ layer 23 in the light sensing part 20 and extinguished. As a result, the dark current caused by the interface level can be reduced. Furthermore, since the vinylidene fluoride compound which forms the ferroelectric layer 6 can be formed at a comparatively low temperature and it has a refractive index which is as low as that of the insulation films 8 and 10, lowering in the photoelectric conversion efficiency caused by reflection can be suppressed. In addition, even if depolarization is caused by use of the solid state imaging device, the original polarization state can be restored by applying the voltage between the electrode and the substrate.

Second Embodiment

Figure 5:
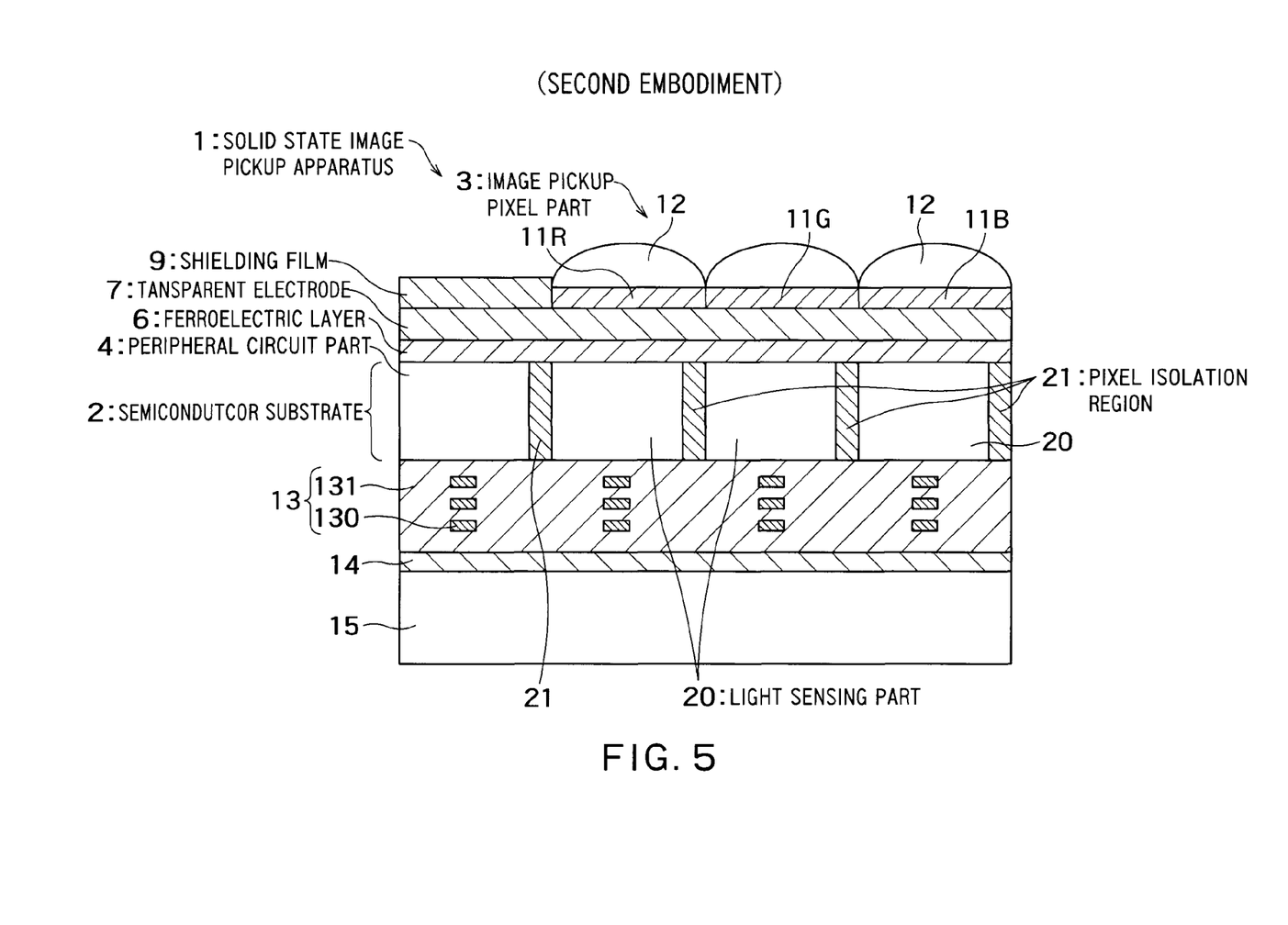
FIG. 5 is a principal part sectional view showing a schematic configuration of a solid state imaging device according to a second embodiment of the present invention.

FIG. 5 is a principal part sectional view showing a schematic configuration of a solid state imaging device according to a second embodiment of the present invention. The present embodiment differs from the first embodiment in that the insulation films 8 and 10 are removed.

In the same way as the first embodiment, the light sensing part 20 and the peripheral circuit part 4 are formed in the semiconductor substrate 2, then the ferroelectric layer 6 is formed on the semiconductor substrate 2, and the transparent electrode 7 is formed on the ferroelectric layer 6. Then, in the first embodiment, the insulation films 8 and 10 are formed. If design equivalent to that using the insulation films can be conducted by using the ferroelectric layer 6 and the transparent electrode 7, however, the insulation film forming process may be omitted.

Third Embodiment

Figure 6:
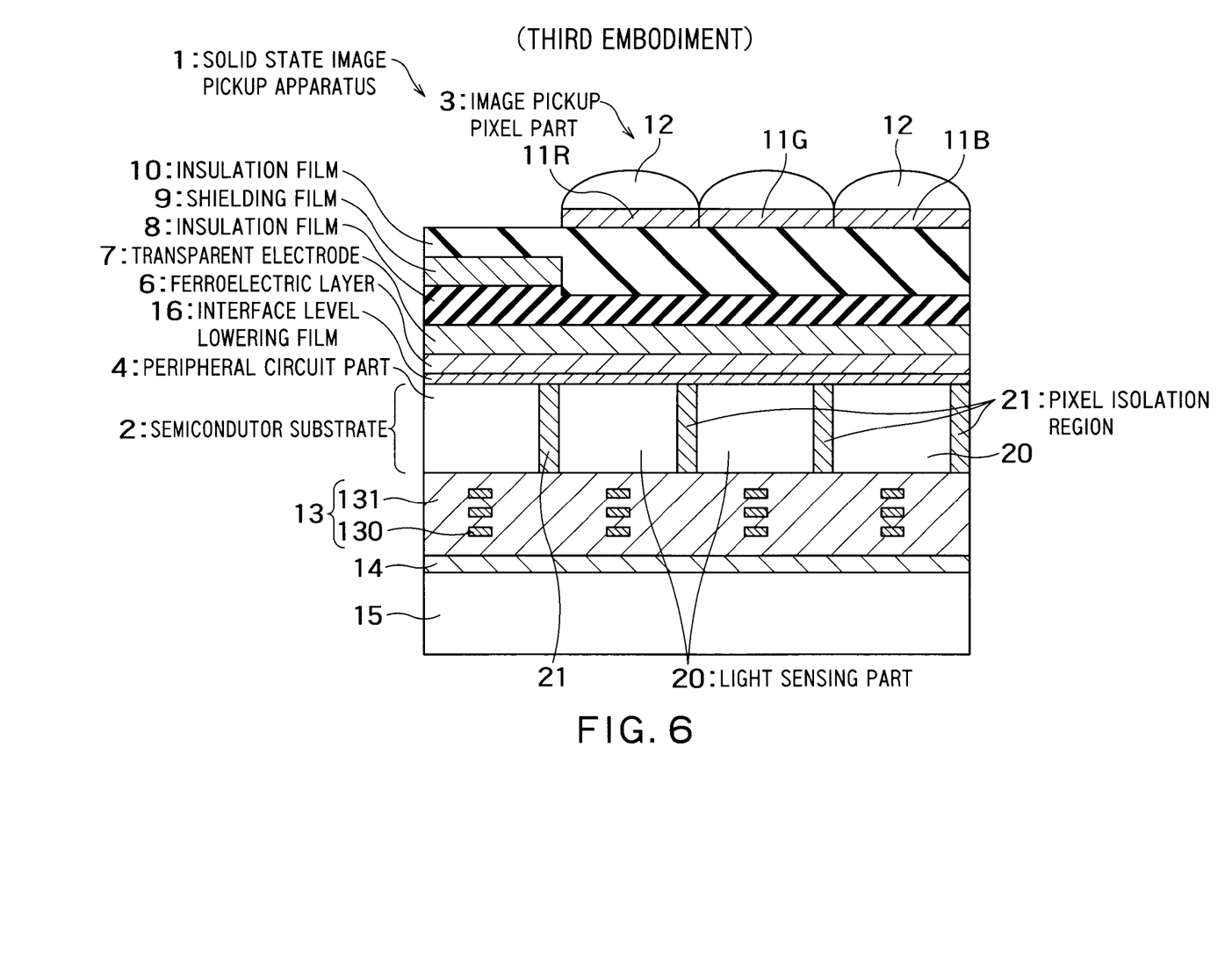
FIG. 6 is a principal part sectional view showing a schematic configuration of a solid state imaging device according to a third embodiment of the present invention.

FIG. 6 is a principal part sectional view showing a schematic configuration of a solid state imaging device according to a third embodiment of the present invention. The present embodiment differs from the first embodiment in that an interface level lowering film 16 is formed before forming the ferroelectric layer 6 on the semiconductor substrate 2.

In the same way as the first embodiment, the light sensing part 20 and the peripheral circuit part 4 are formed in the semiconductor substrate 2. Before forming the ferroelectric layer 6 on the semiconductor substrate 2, the interface level lowering film 16 is formed on the semiconductor substrate 2 as a thin oxide film to lower the interface level. Then, the ferroelectric layer 6 is formed on the interface level lowering film 16, and ensuing processes become the same as those in the first embodiment.

As the interface level lowering film 16, for example, a silicon oxide film, a silicon oxide nitride film, a silicon nitride film, or the like can be used. The interface level lowering film 16 has a film thickness in the range of 0.1 to 5 nm. The interface level lowering film 16 can be formed by using the ALD (Atomic Layer Deposition) method, the CVD method, the spin coat method or the like.

According to the present embodiment, it becomes possible to lower the interface level, suppress electron generation caused by the interface level, and take better advantage of merits of the ferroelectric layer 6.

Fourth Embodiment

Figure 7:
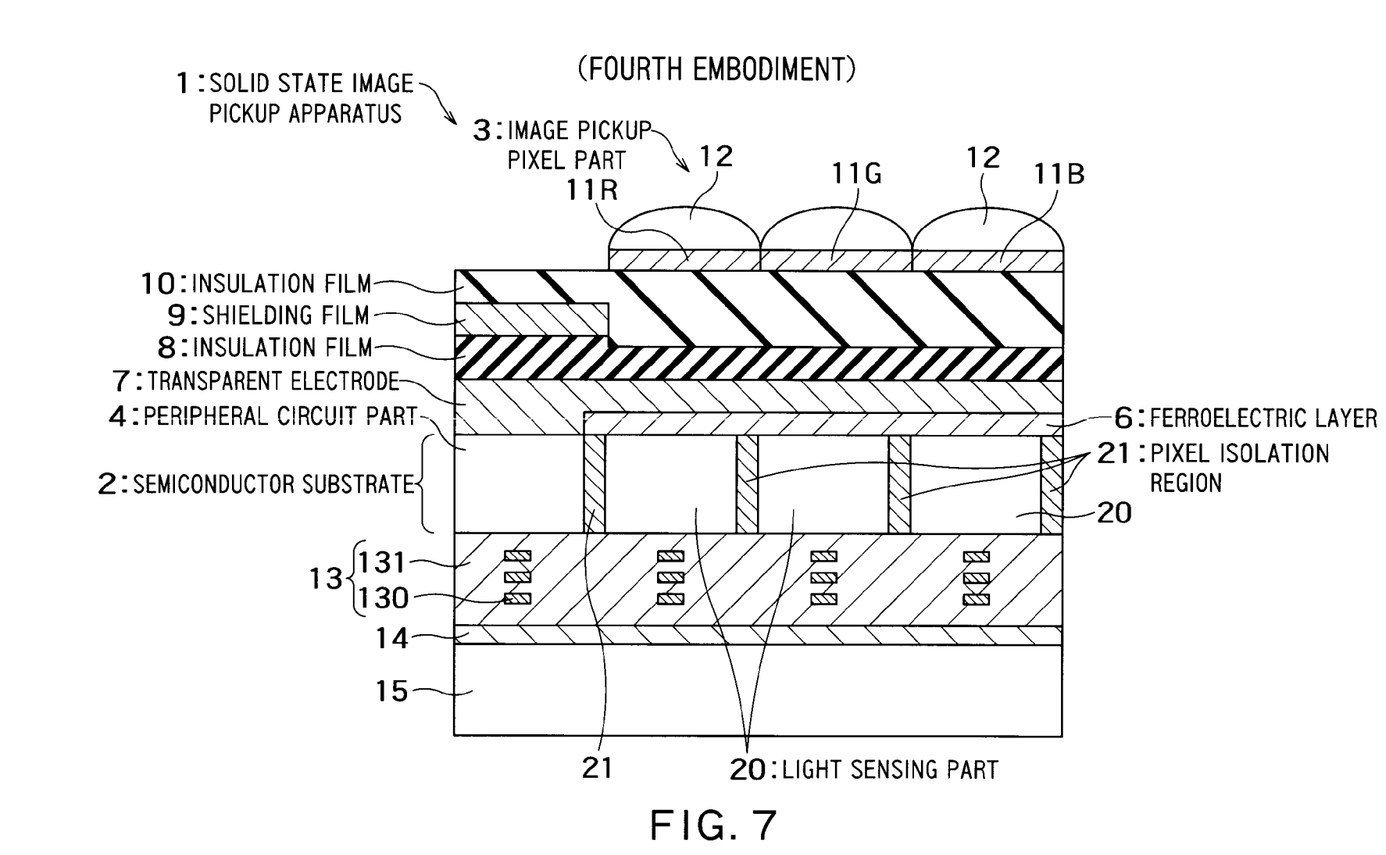
FIG. 7 is a principal part sectional view showing a schematic configuration of a solid state imaging device according to a fourth embodiment of the present invention.

FIG. 7 is a principal part sectional view showing a schematic configuration of a solid state imaging device according to a fourth embodiment of the present invention. The present embodiment differs from the first embodiment in that a part of the ferroelectric layer 6 located on the peripheral circuit part 4 is selectively removed.

As the interface level lowering film 16, for example, a silicon oxide film can be used.

In the same way as the first embodiment, the light sensing part 20 and the peripheral circuit part 4 are formed in the semiconductor substrate 2 and then the ferroelectric layer 6 is formed on the semiconductor substrate 2. Then, a part of the ferroelectric layer 6 located on the peripheral circuit part 4 is selectively removed. Ensuing processes become the same as those in the first embodiment.

According to the present embodiment, it is possible to prevent false operations caused by holes generated on the peripheral circuit 4 when the ferroelectric layer 6 is polarized.

Fifth Embodiment

Figure 8:
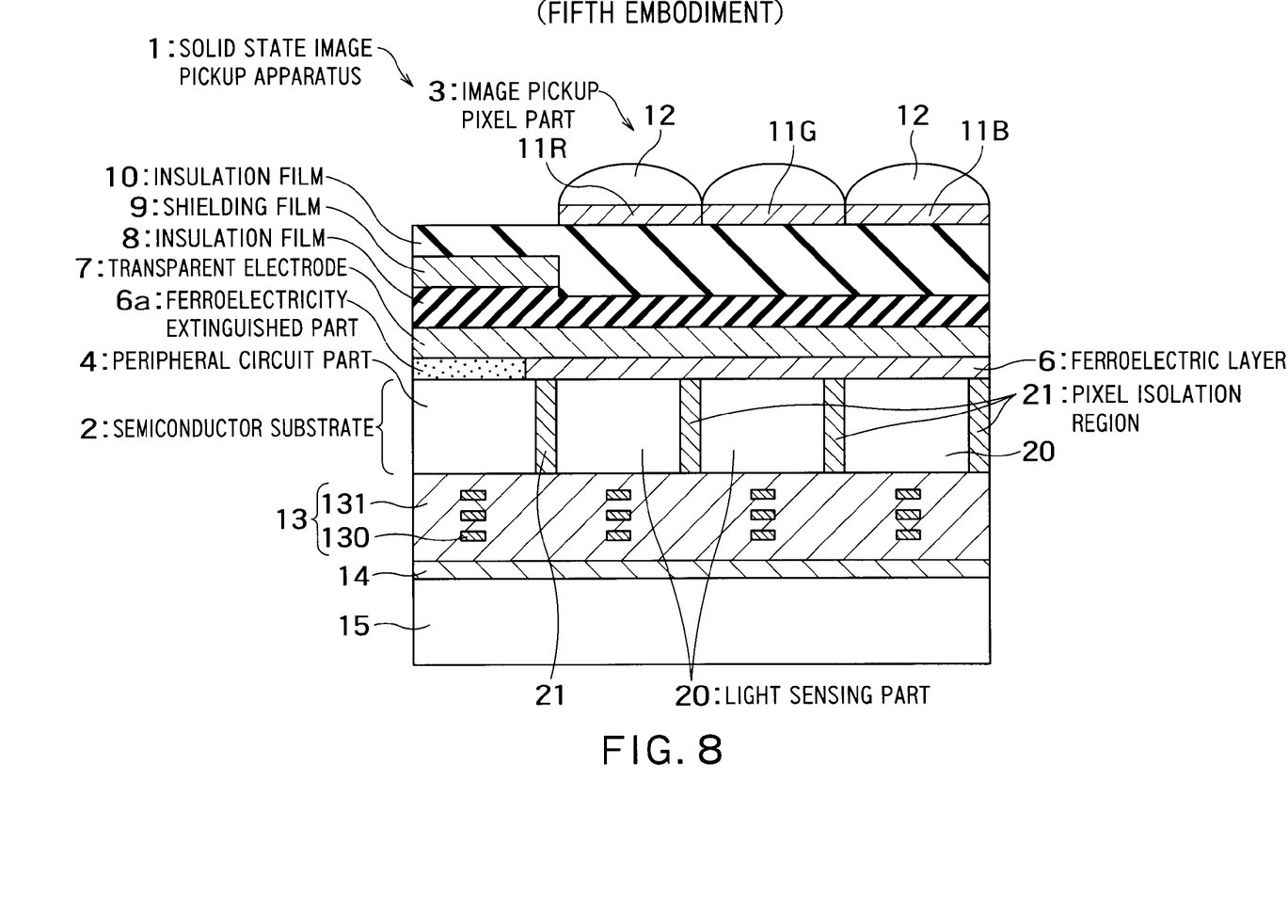
FIG. 8 is a principal part sectional view showing a schematic configuration of a solid state imaging device according to a fifth embodiment of the present invention.

FIG. 8 is a principal part sectional view showing a schematic configuration of a solid state imaging device according to a fifth embodiment of the present invention. The present embodiment differs from the first embodiment in that ferroelectricity is lost selectively in a part of the ferroelectric layer 6 located on the peripheral circuit part 4.

In the same way as the first embodiment, the light sensing part 20 and the peripheral circuit part 4 are formed in the semiconductor substrate 2 and then the ferroelectric layer 6 is formed on the semiconductor substrate 2. Then, a part of the ferroelectric layer 6 located on the peripheral circuit part 4 is selectively heated (annealed) to 150° C. or above or 200° C. or above, and melted. As a result, a ferroelectricity extinguished part 6a in which ferroelectricity is extinguished is formed.

According to the present embodiment, effects similar to those in the fourth embodiment can be obtained.

Sixth Embodiment

Figure 9:
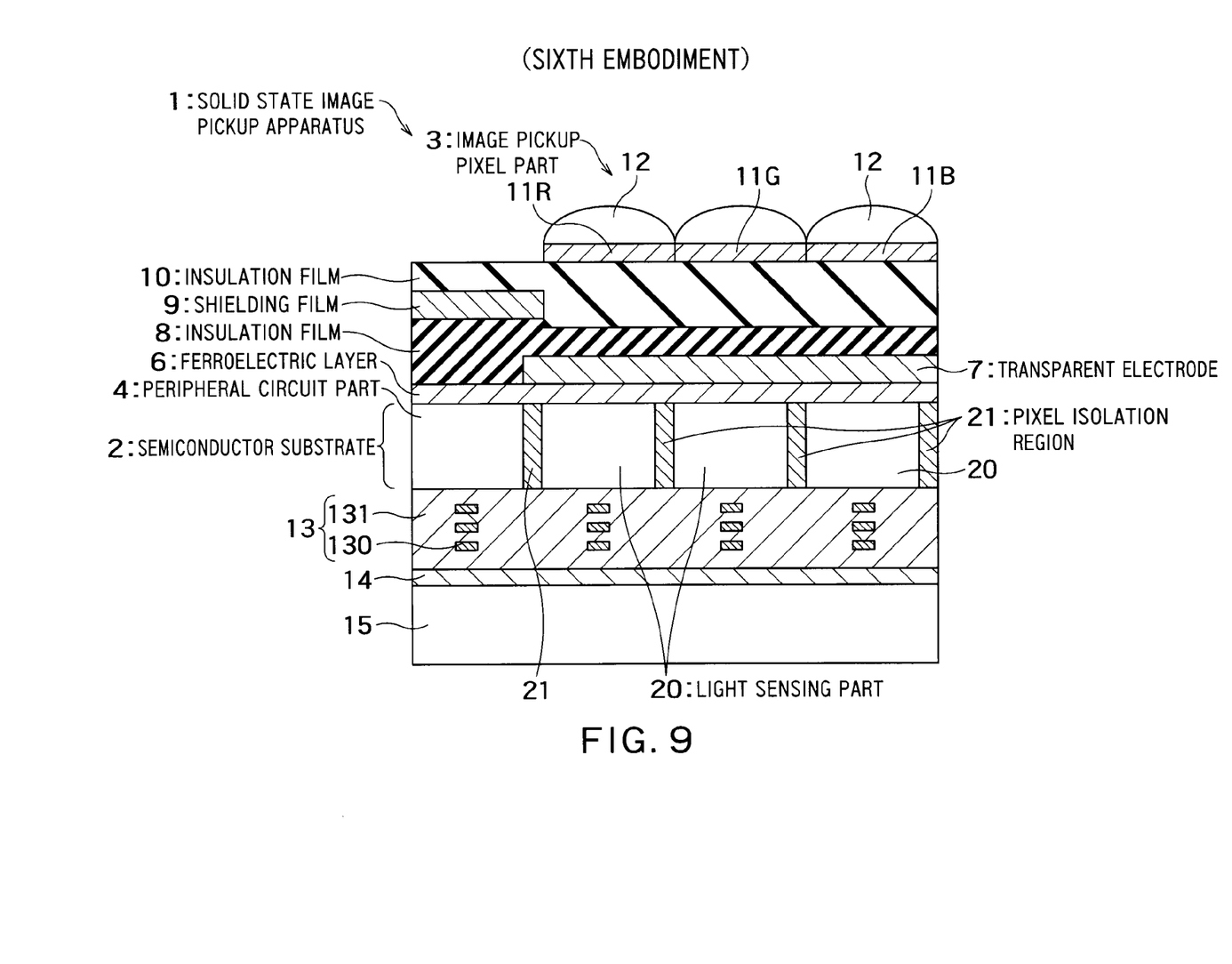
FIG. 9 is a principal part sectional view showing a schematic configuration of a solid state imaging device according to a sixth embodiment of the present invention.

FIG. 9 is a principal part sectional view showing a schematic configuration of a solid state imaging device according to a sixth embodiment of the present invention. The present embodiment differs from the first embodiment in that a part of the transparent electrode 7 located over the peripheral circuit part 4 is selectively removed.

In the same way as the first embodiment, the light sensing part 20 and the peripheral circuit part 4 are formed in the semiconductor substrate 2 and then the ferroelectric layer 6 is formed on the semiconductor substrate 2. Then, when forming a film of the transparent electrode 7, the film is formed with a pattern cleared of a part of the transparent electrode 7 located over the peripheral circuit part 4 by using a mask.

According to the present embodiment, the ferroelectric layer 6 located on the peripheral circuit part 4 is not poled and it has no polarization, and effects similar to those in the fourth embodiment can be obtained.

Seventh Embodiment

As for a solid state imaging device according to a seventh embodiment, the light sensing part 20 and the peripheral circuit part 4 are formed in the semiconductor substrate 2, then the ferroelectric layer 6 is formed on the semiconductor substrate 2, and the transparent electrode 7 is formed on the ferroelectric layer 6, in the same way as the first embodiment. Then a part of the transparent electrode 7 located on the peripheral circuit part 4 is removed.

According to the present embodiment, the ferroelectric layer 6 located on the peripheral circuit part 4 is not poled and it has no polarization, and effects similar to those in the fourth embodiment can be obtained.

The present invention is not restricted to the embodiments, but various modifications can be implemented. For example, the embodiments have been described supposing that the solid state imaging device is a back side illumination CMOS sensor. However, the present invention can be applied to a back side illumination CCD (Charge Coupled Device) sensor as well.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A solid state imaging device comprising:
a light sensing part which conducts photoelectric conversion on incident light;
a ferroelectric layer including an organic compound on a surface of the light sensing part on which light is incident;
a transparent electrode formed on the ferroelectric layer;
a color filter layer formed on the transparent electrode; and
a condenser lens formed on the color filter layer.

2. The solid state imaging device according to claim 1, wherein the ferroelectric layer comprises a vinylidene fluoride compound.

3. The solid state imaging device according to claim 2, wherein the vinylidene fluoride compound is a vinylidene fluoride (VDF), a polyvinylidene fluoride (PVDF), a copolymer (VDF/TrFE) of vinylidene fluoride (VDF) and ethylene trifluoride (TrFE) or a copolymer (VDF/TeFE) of vinylidene fluoride (VDF) and ethylene tetrafluoride (TeFE).

4. The solid state imaging device according to claim 1, wherein the ferroelectric layer is a material which can be formed at 200° C. or below.

5. The solid state imaging device according to claim 1, wherein the ferroelectric layer is a material which can be formed at 150° C. or below.

6. The solid state imaging device according to claim 1, further comprising an insulation film formed between the transparent electrode and the color filter layer.

7. The solid state imaging device according to claim 1, wherein the light sensing part formed in a semiconductor substrate.

8. The solid state imaging device according to claim 7, further comprising:
   an interconnection layer formed under the semiconductor substrate;
   a support substrate formed of a silicon substrate bonded to the bottom of the interconnection layer by an adhesive agent.

* * * * *